United States Patent [19]

Heppinstall

[11] Patent Number: 5,281,923
[45] Date of Patent: Jan. 25, 1994

[54] AMPLIFYING ARRANGEMENTS WHICH MODULATE AN ELECTRON BEAM

[75] Inventor: Roy Heppinstall, Witham, United Kingdom

[73] Assignee: EEV Limited, Chelmsford, United Kingdom

[21] Appl. No.: 730,166

[22] Filed: Jul. 16, 1991

[30] Foreign Application Priority Data

Jul. 20, 1990 [GB] United Kingdom ............... 9016017

[51] Int. Cl.⁵ ........................ H03F 3/56; H01J 25/02
[52] U.S. Cl. ............................. 330/45; 315/5.15; 315/5.37; 315/5.43
[58] Field of Search ............... 315/5.15, 5.37, 5.39, 315/5.43, 5.51; 330/44, 45

[56] References Cited

U.S. PATENT DOCUMENTS

| 2,500,945 | 3/1950 | Hansen | 331/79 X |
|---|---|---|---|
| 2,758,246 | 8/1956 | Norton | 315/5.43 X |
| 2,972,081 | 2/1961 | Bridges et al. | 315/5.43 X |
| 2,974,252 | 3/1961 | Quate | 315/5.43 X |
| 3,101,449 | 8/1969 | Ashkin | 315/5.43 X |
| 4,527,091 | 7/1985 | Preist | 315/5.37 X |
| 4,611,149 | 9/1986 | Nelson | 315/5.39 |

FOREIGN PATENT DOCUMENTS

| 1466561 | 9/1969 | Fed. Rep. of Germany | 330/45 |
|---|---|---|---|
| 843583 | 8/1960 | United Kingdom | 315/5.43 |

Primary Examiner—Benny T. Lee
Attorney, Agent, or Firm—Spencer, Frank & Schneider

[57] ABSTRACT

An amplifying arrangement employs both density and velocity modulation of an electron beam in order to produce amplification of a high frequency signal. In one embodiment, density modulation is produced at the cathode region, a first carrier signal being applied between a cathode and a modulation grid to produce bunching of electrons. The density modulated electron beam is then velocity modulated at a first resonant cavity. It is preferred that the first carrier signal is twice the frequency of the carrier signal producing the velocity modulation. The arrangement may be such that, at the final resonant cavity, adjacent electron bunches produced by density modulation combine, thus giving a high efficiency amplifying arrangement.

7 Claims, 3 Drawing Sheets

AMPLIFYING ARRANGEMENTS WHICH MODULATE AN ELECTRON BEAM

FIELD OF THE INVENTION

This invention relates to amplifying arrangements and more particularly to arrangements in which amplification of an applied high frequency signal is achieved by modulating an electron beam.

BACKGROUND OF THE INVENTION

Klystrons are a class of amplifier in which a signal to be amplified is coupled into an input resonant cavity and produces an electric field which acts on electrons of the beam to modify their velocity. Some electrons are accelerated whilst others are retarded, producing bunching (that is, density modulation of the beam) at some position further down the tube. Typically, there are several subsequent resonant cavities to increase the amount of bunching and a final resonant cavity at which the amplified signal is extracted.

Another type of amplifying arrangement, known as a klystron-tetrode, also utilises modulation of an electron beam to obtain amplification of an applied signal. In this case, a density modulated beam is produced by applying an input signal to be amplified to a modulation grid positioned near to and in front of an electron gun cathode. Emission of electrons is alternately inhibited and allowed, producing bunching of electrons. The bunched beam is accelerated down the tube to an output resonant cavity at which an amplified signal is extracted.

For both klystrons and klystron-tetrodes the input signal which produces bunching of electron beam is a radio frequency (RF) signal, that is, a signal oscillating in the range 470 to 860 MHz. For television requirements, the input carrier signal is modulated in amplitude and by having a relatively low frequency colour subcarrier imposed on it, these modulating signals being known as video signals. The colour sub-carrier has a frequency of the order of 4 MHz, the exact value depending on the type of television standard being used.

SUMMARY OF THE INVENTION

The present invention arose from an attempt to provide an amplifying arrangement having a particularly high efficiency and offering good performance.

According to the invention there is provided a high frequency amplifying arrangement comprising means arranged to density modulate an electron beam with a first high frequency carrier signal and means arranged to velocity modulate the density modulated beam with a second high frequency carrier signal having a different frequency to the first to produce amplification.

Preferably, the first and second high frequency carrier signals are radio frequency signals.

It might be thought that there would be no further advantage in imposing two high frequency carrier signals to give both velocity modulation and density modulation on an electron beam rather than only using one type of modulation. If the velocity modulation is imposed on an already density modulated beam using a signal having the same frequency as the density modulation signal, the change in velocity of all the electrons in the beam is substantially the same. Thus there is no, or very little, relative movement between electrons in the beam. In any case, the degree of bunching efficiency obtainable using density modulation alone may be made relatively high and cannot readily be increased using velocity modulation at the same frequency.

However, by ensuring that the two types of modulation are produced using different frequencies, an increase in bunching efficiency may be achieved. Relatively large numbers of electrons may be included in each bunch with good definition being achieved between bunches. Advantageously, the first carrier signal which produces density modulation is substantially twice the frequency of the second carrier frequency signal which produces velocity modulation. It is possible to obtain tight initial bunching of electrons using density modulation, there being relatively few electrons produced between bunches. Successive bunches will arrive at the location in the arrangement where the velocity modulation is to be imposed in phase and in anti-phase with the second carrier signal. Thus, all the electrons in one bunch will tend to be decelerated and those in the next bunch accelerated. It is preferred that the velocity modulation is arranged such that adjacent bunches of electrons produced by the density modulation tend to be brought together into one larger bunch. This bunching may be achieved using only one resonant cavity but an improvement in bunching efficiency may be obtained by including further resonant cavities.

Where an arrangement in accordance with the invention is used in a television system, means are included for applying video signals to the carrier modulated electron beam.

BRIEF DESCRIPTION OF DRAWINGS

Some ways in which the invention may be performed are now described by way of example with reference to the accompanying drawing in which.

DESCRIPTION OF PREFERRED EMBODIMENTS

Figure 1:
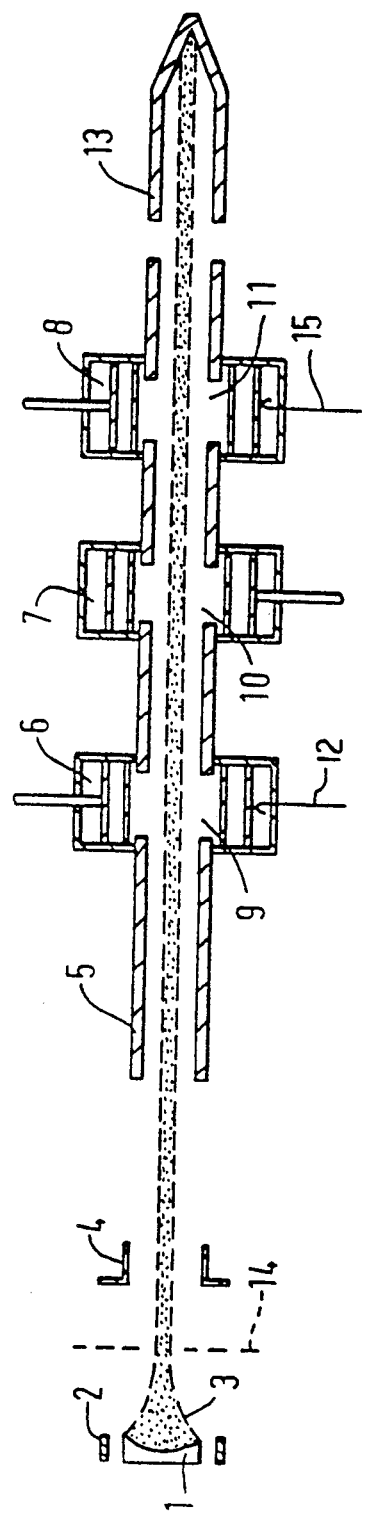
FIG. 1 schematically illustrates in longitudinal section an amplifying arrangement in accordance with the invention.

With reference to FIG. 1, an amplifying arrangement in accordance with the invention includes means for both density modulating and velocity modulating an electron beam in order to obtain amplification of an applied signal.

Electrons are emitted from the front surface of a cathode 1 and focused by an electrode 2 into a beam 3. The beam 3 is transmitted along the longitudinal axis (not shown) of the arrangement, being accelerated by anode 4 and entering a drift space 5. A number of resonant cavities, in this case three cavities, 6, 7 and 8, are distributed in the arrangement and are coupled via drift tube gaps 9, 10 and 11 respectively. After travelling through this part of the arrangement, the electrons of the beam are received at a collector 13.

The electron beam is density modulated at the cathode region by varying the potential difference between the cathode 1 and a modulation grid 14 at a first carrier frequency, which in this arrangement is an RF signal. Emission of electrons is alternately inhibited and allowed, causing bunches of electrons to be produced.

When the density modulated electron beam reaches the first resonant cavity 6, it is velocity modulated by the application of a second carrier signal via an input coupling element 12, the second carrier signal having substantially half the frequency of the first carrier signal. Increased velocity modulation is achieved at the subsequent cavities 7 and 8 and the final, amplified signal is extracted at an output coupling element 15.

Figure 2:
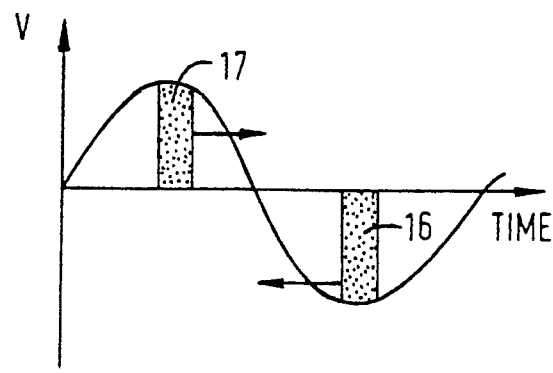
FIG. 2 is an explanatory diagram relating to the operation of the arrangement shown in FIG. 1.

FIG. 2 shows the effect of the velocity modulation on the already density modulated electron beam. The density modulated electron bunches are indicated as shaded areas and the sinusoidal line represents the change in potential applied across the first drift tube gap 9. The first bunch 16 of the electrons shown arrives at the first resonant cavity 6 during a period of the applied second carrier signal when the electric field produced has a retarding effect. Consequently, the electrons of the bunch 16 are decelerated, as indicated by the arrow. The next bunch of electrons 17 to arrive at the gap 9 arrive during the in-phase part of the cycle and are accelerated. Thus relative movement is produced between the electron bunches 16 and 17. Further relative movement occurs along the tube and, at the final cavity 8, the two bunches 16 and 17 arrive simultaneously. Thus, this arrangement enables high efficiencies to be achieved as large numbers of electrons may be included in bunches which are well defined. The frequency of the signal at the final cavity 8 is half that of the first carrier signal.

Figure 3:
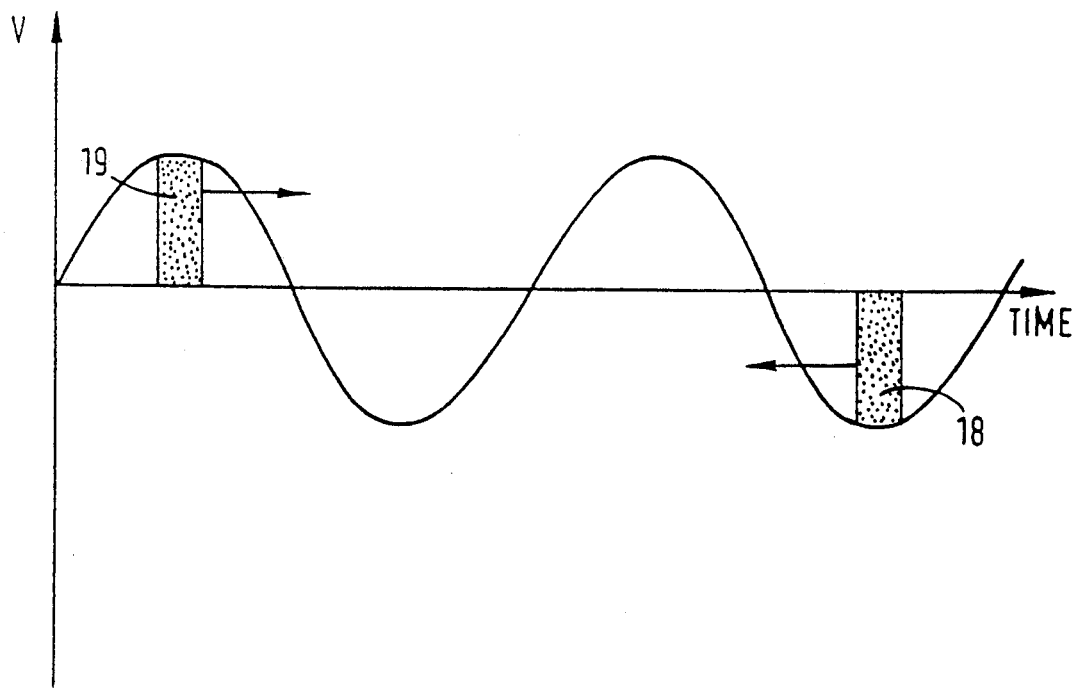
FIG. 3 is a further explanatory diagram.

The example described with reference to FIGS. 1 and 2 is one way in which the invention may be performed. In the example the signal producing the density modulation is at twice the frequency of the signal producing the velocity modulation so that successive electron bunches arrive at the first resonant cavity 6 at each half cycle of the signal applied to the cavity. The electron bunches are thus velocity modulated so that adjacent bunches of electrons are brought together to form one bunch. It will be appreciated however that other arrangements are possible in which the frequency of the density modulating signal on the grid and the frequency of the velocity modulating signal at the input cavity are in a different ratio. This is illustrated with reference to the explanatory diagram of FIG. 3. The density modulated electron bunches are indicated by the shaded areas and the sinusoidal line represents the change in potential applied across the drift tube gap 9. The first bunch 18 of the electrons shown arrives at the first resonant cavity during a period of the applied second carrier signal when the electric field produced has a retarding effect. Consequently the electrons of the bunch 18 are decelerated, as indicated by the arrow. The next bunch of electrons 19 arrive at the gap 9 at a time when the potential across the drift tube gap 9 has changed by one and a half cycles. The electrons in the bunch 19 are thus accelerated and relative movement is produced between the electron bunches 18 and 19. In this example also adjacent bunches of electrons are brought together to form one bunch. However the frequency of the density modulating signal applied to the grid is two-thirds of the frequency of the velocity modulating signal applied to the cavity 6.

The invention may be performed using a density modulating signal and a velocity modulating signal having frequencies in other ratios.

Figure 4:
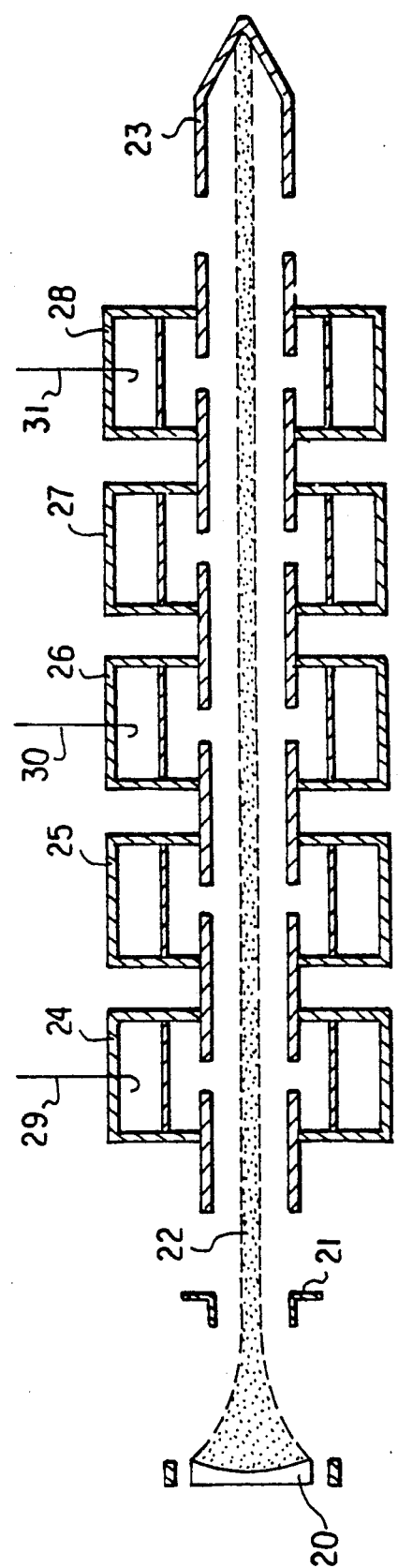
FIG. 4 schematically illustrates in longitudinal section another amplifying arrangement in accordance with the invention.

With reference to FIG. 4, an arrangement in accordance with the invention includes a cathode 20 and an anode 21 which are arranged to accelerate electrons in a beam 22 along the longitudinal axis (not shown) of the arrangement to a collector 23. A plurality of resonant cavities 24, 25, 26, 27, and 28 are disposed along the beam path between the anode 21 and collector 23. When the beam arrives at the first cavity 24 it is unmodulated by any carrier signal.

A first high frequency carrier signal is applied to the first cavity 24 via an input coupling element 29 and produces velocity modulation of the electron beam. The beam has become density modulated by the time it reaches a third cavity 26 after passing an intermediate cavity 25 which enhances this process.

The velocity modulated electrons of the beam move relative to one another as some are speeded up and others are retarded so as to produce bunches of electrons, that is, to cause the beam to become density modulated by the time it reaches the third cavity 26. As those skilled in the art will recognize, the provision of an intermediate cavity 25 between the first and third cavities 24 and 26 enables tighter bunching to be achieved compared to what would otherwise be possible.

A second high frequency carrier signal is applied via an input coupling element to the density modulated beam at the third cavity 26, this second carrier signal being at a different frequency to the first. Further velocity modulation of the density modulated beam takes place, the amplified signal being coupled out of the final cavity 28 via an output coupling element 31. Another intermediate cavity 27 enhances the process.

Of course, the intermediate cavities may be omitted from the arrangement or additional ones may be included if desired.

I claim:

1. A high frequency amplifying arrangement, comprising: means for producing an electron beam; first modulation means, arranged adjacent the electron beam and responsive to a first high frequency carrier signal having a first frequency, for density modulating the electron beam with the first high frequency carrier signal to produce a density modulated beam having a sequence of bunches of electrons; and second modulation means, arranged adjacent the density modulated beam and responsive to a second high frequency carrier signal having a second frequency that is different from the first frequency, for velocity modulating the density modulated beam with the second high frequency carrier signal so as to bring two adjacent bunches of electrons produced by the density modulation together into a single bunch of electrons, the second modulation means including an output resonant cavity, wherein an amplified high frequency signal is generated by the density and velocity modulation interacting with the output cavity, the output resonant cavity being tuned to a frequency that is lower than the first frequency, and wherein said amplified signal is extracted therefrom.

2. An amplifying arrangement as claimed in claim 1, wherein the first frequency is substantially twice the second frequency.

3. An arrangement as claimed in claim 1, wherein the amplified signal has a frequency that is half the frequency of the first carrier signal.

4. An amplifying arrangement as claimed in claim 1, wherein the electron beam extends along an electron beam path, and wherein the second modulation means further comprises at least one additional resonant cavity, the output resonant cavity and the at least one additional resonant cavity being spaced along the electron beam path.

5. An amplifying arrangement as claimed in claim 1, wherein the means for producing an electron beam comprises a cathode, and wherein the first modulation means comprises a grid, the first carrier signal being applied between the grid and the cathode.

6. An arrangement as claimed in claim 1, wherein said first and second carrier signals are both radio frequency signals.

7. A high frequency arrangement, comprising: means for producing an electron beam; first modulation means, arranged adjacent the electron beam and responsive to a first high frequency carrier signal having a first frequency, for density modulating the electron beam with the first high frequency carrier signal to produce a density modulated beam having a sequence of bunches of electrons; and second modulation means, arranged adjacent the density modulated beam and responsive to a second high frequency carrier signal having a second frequency that is different from the first frequency, for velocity modulating the density modulated beam with the second high frequency carrier signal so as to bring two adjacent bunches of electrons produced by the density modulation together into a single bunch of electrons, wherein the first modulation means comprises at least one resonant cavity through which the electron beam passes, the first carrier signal being applied to the at least one resonant cavity of the first modulation means, and wherein the second modulation means comprises at least one resonant cavity through which the density modulated beam passes, the second carrier signal being applied to the at least one resonant cavity of the second modulation means.

* * * * *